(12) United States Patent  
Lee

(10) Patent No.: US 7,589,368 B2  
(45) Date of Patent: Sep. 15, 2009

(54) THREE-DIMENSIONAL MEMORY DEVICES

(75) Inventor: Ming Hsiu Lee, Hsinchu (TW)

(73) Assignee: MICRONIX International Co., Ltd., Hsinchu (TW)

( * ) Notice: Subject to any disclaimer, the term of this patent is extended or adjusted under 35 U.S.C. 154(b) by 495 days.

(21) Appl. No.: 11/385,061

(22) Filed: Mar. 21, 2006

(65) Prior Publication Data

US 2006/0208304 A1    Sep. 21, 2006

Related U.S. Application Data

(60) Provisional application No. 60/663,866, filed on Mar. 21, 2005.

(51) Int. Cl.  
*H01L 29/72*    (2006.01)

(52) U.S. Cl. .................. 257/296; 257/390; 365/185.17; 365/185.19; 365/185.08; 365/230.06

(58) Field of Classification Search .................. 257/296, 257/390; 365/185.08, 185.17, 185.19, 230.06  
See application file for complete search history.

(56) References Cited

U.S. PATENT DOCUMENTS

2006/0285423 A1* 12/2006 Scheuerlein ........... 365/230.06  
2007/0247921 A1* 10/2007 Bhattacharyya ........ 365/185.28

* cited by examiner

*Primary Examiner*—Edward Wojciechowicz  
(74) *Attorney, Agent, or Firm*—Jianq Chyun IP Office

(57) ABSTRACT

Memory devices are disclosed. One example of a memory device may include two layers of memory arrays each containing at least four memory cells. In particular, the memory device includes two word lines commonly shared by the two layers of the memory arrays, with the word lines coupled with the memory cells and providing gate regions of the memory cells. Additionally, a first pair of bit lines cross under the two word lines and providing source and drain regions to the first layer of the two layers of the memory arrays, and a second pair of bit lines cross over the two word lines and providing source and drain regions to the second layer of the two layers of the memory arrays. A first set of channel regions are disposed between the source and drain regions to the first layer of the two layers of the memory arrays, and a second set of channel regions are disposed between the source and drain regions to the second layer of the two layers of the memory arrays. In addition, charge storage regions are provided with each of them disposed between a corresponding word line and a corresponding channel region.

30 Claims, 11 Drawing Sheets

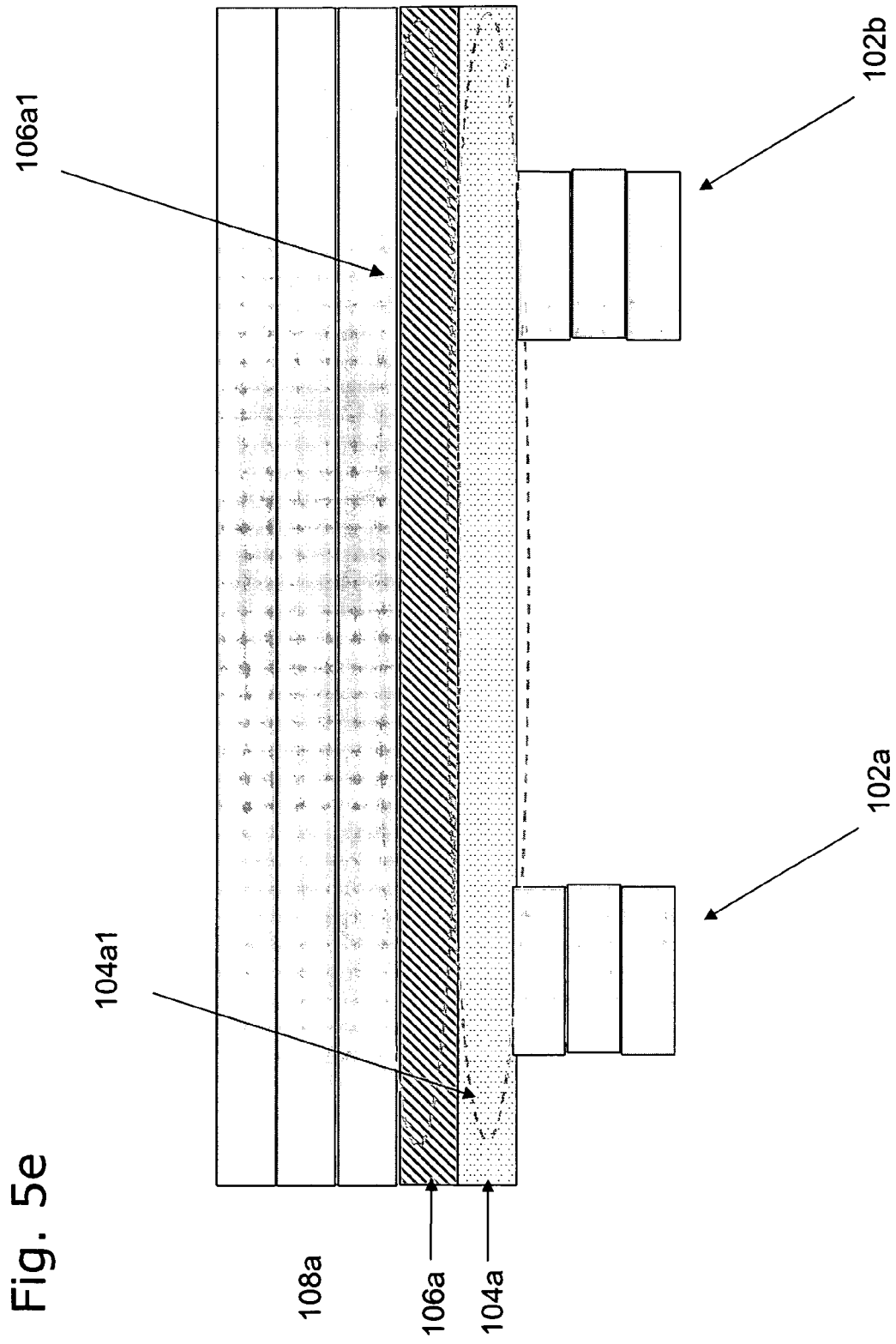

THREE-DIMENSIONAL MEMORY DEVICES

CROSS-REFERENCE TO RELATED APPLICATIONS

This application claims priority to U.S. Provisional Application No. 60/663,866, entitled "Three-Dimensional Memory Devices and Method of Manufacturing and Operating the Same", filed Mar. 21, 2005.

BACKGROUND OF THE INVENTION

The invention relates to memory devices, and, specifically, relates to three-dimensional memory devices.

Generally, non-volatile memory devices may implement various design features. One of them includes a so-called SONOS (silicon-oxide-nitride-oxide-silicon) design, which may use a thin tunnel oxide to allow direct-tunneling erase. FIG. 1 illustrates an example of a SONOS non-volatile memory device. Referring to FIG. 1, the memory device may include a source region 10 and a drain region 12, an active or channel region 14, a gate dielectric layer 16 over the active region 14, and a gate 18 over the gate dielectric layer 16. Generally, the active region 14 may be formed adjacent to, such as over or between, the source and drain regions 10 and 12. And the gate dielectric 16 may have an "ONO" structure having two silicon oxide layers with a silicon nitride layer in-between.

Conventional memory devices provide memory cells or storage units in a two-dimensional design to facilitate operation. However, with the development of portable and many other devices requiring a large number of memory cells within a limited chip space, there is a need for non-volatile memory devices that can provide more memory cells within a limited space.

BRIEF SUMMARY OF THE INVENTION

Examples consistent with the invention disclose memory devices. A memory device may include a first pair of bit lines; a first pair of word lines over the first pair of bit lines and configured to cross over the first pair of bit lines; and a first pair of channel regions substantially parallel with the first pair of word lines and each disposed at least between the locations where a corresponding word line of the first pair of word lines crosses over the first pair of bit lines and disposed between the corresponding word line and the first pair of bit lines. Additionally, the memory device may include a first set of charge storage regions each disposed at least between the corresponding word line and a corresponding channel region of the first pair of channel regions; a second pair of bit lines over the first pair of word lines and configured to cross over the first pair of word lines; and a second pair of channel regions substantially parallel with the first pair of word lines and each disposed at least between the locations where the second pair of bit lines cross over the corresponding word line and disposed between the second pair of bit lines and the corresponding word line. Furthermore, a second set of charge storage regions may be provided with each of them disposed at least between the corresponding word line and the corresponding channel region.

Examples consistent with the invention further disclose an alternative configuration of memory devices. A memory device may include two layers of memory arrays each containing at least four memory cells; two word lines commonly shared by the two layers of the memory arrays, the word lines coupled with the memory cells and providing gate regions of the memory cells; a first pair of bit lines crossing under the two word lines and providing source and drain regions to a first layer of the two layers of the memory arrays; and a second pair of bit lines crossing over the two word lines and providing source and drain regions to a second layer of the two layers of the memory arrays. Additionally, the memory device may include a first set of channel regions disposed between the source and drain regions to the first layer of the two layers of the memory arrays; a second set of channel regions disposed between the source and drain regions to the second layer of the two layers of the memory arrays; and charge storage regions each disposed between a corresponding word line of the two word lines and a corresponding channel region of the first and second sets of channel regions.

Examples consistent with the invention further disclose further other alternative configurations of memory devices. A memory device may include: two layers of memory arrays each containing at least four memory cells; two bit lines commonly shared by the two layers of the memory arrays, the bit lines coupled with the memory cells and providing source and drain regions of the memory cells; a first pair of word lines crossing under the two bit lines and providing gate regions to a first layer of the two layers of the memory arrays; and a second pair of word lines crossing over the two bit lines and providing gate regions to a second layer of the two layers of the memory arrays. The memory device may further include: channel regions disposed between the source and drain regions; and charge storage regions each disposed between a corresponding word line of the first and second pairs of word lines and a corresponding channel region of the channel regions.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIGS. 5a-5f illustrate exemplary structures of three-dimensional memory devices in examples consistent with the invention.

DETAILED DESCRIPTION OF THE INVENTION

Examples consistent with the invention disclose three-dimensional memory devices. The memory device may use thin-film-transistor memory cells having a charge storage region. The memory cells may be organized in planes each having a two-dimensional memory array, and the planes may be stacked vertically for providing multiple layers of memory arrays to form a three-dimensional memory device. In some examples, the neighboring planes of memory arrays may share common gate regions (or word lines) or common source and drain regions (or bit lines). Accordingly, examples consistent with the invention may provide a large number of memory cells or storage units within a limited area or substrate area compared to traditional memory arrays.

In some examples, silicon nitride may be used as a charge-storage or charge-trapping region for thin-film-transistor ("TFT") memory devices. Nitride-storage TFTs may provide programmable and erasable devices, and the devices can be used for various applications, such as for one-time programmable memory (OTP), multiple-time programmable memory (MTP), or FLASH memory devices allowing numerous cycles of programming and erasing operations.

Additionally, a non-volatile memory, such as a SONOS memory, may allow programming and erasing operations in various different ways. For example, a program or erase (P/E) operation may change the threshold voltage of a memory cell, thereby indicating a different status of one or more bits of stored data.

In one example, nitride storage TFTs, such as SONOS TFT, may be organized in memory arrays and stacked over each other. For example, layers of bit lines and word lines may cross with each other to provide memory cells in a three-dimensional structure. Accordingly, a memory device may provide a large amount of storage cells within a limited space.

Figure 1:
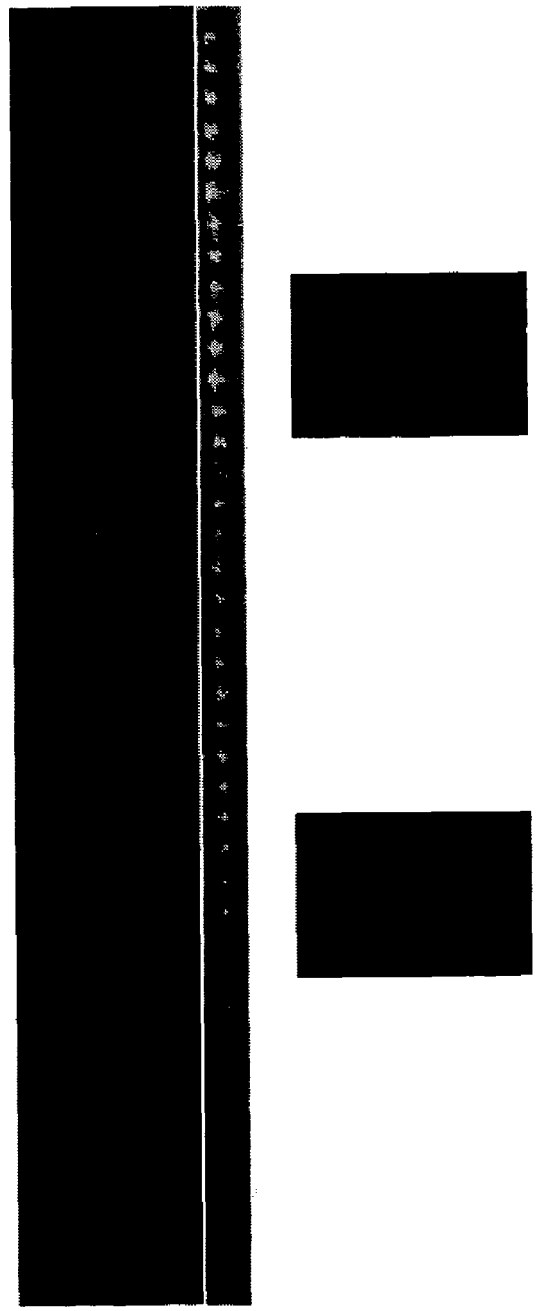
FIG. 1 illustrates a cross-sectional view of an exemplary memory device in the prior art.
Figure 2:
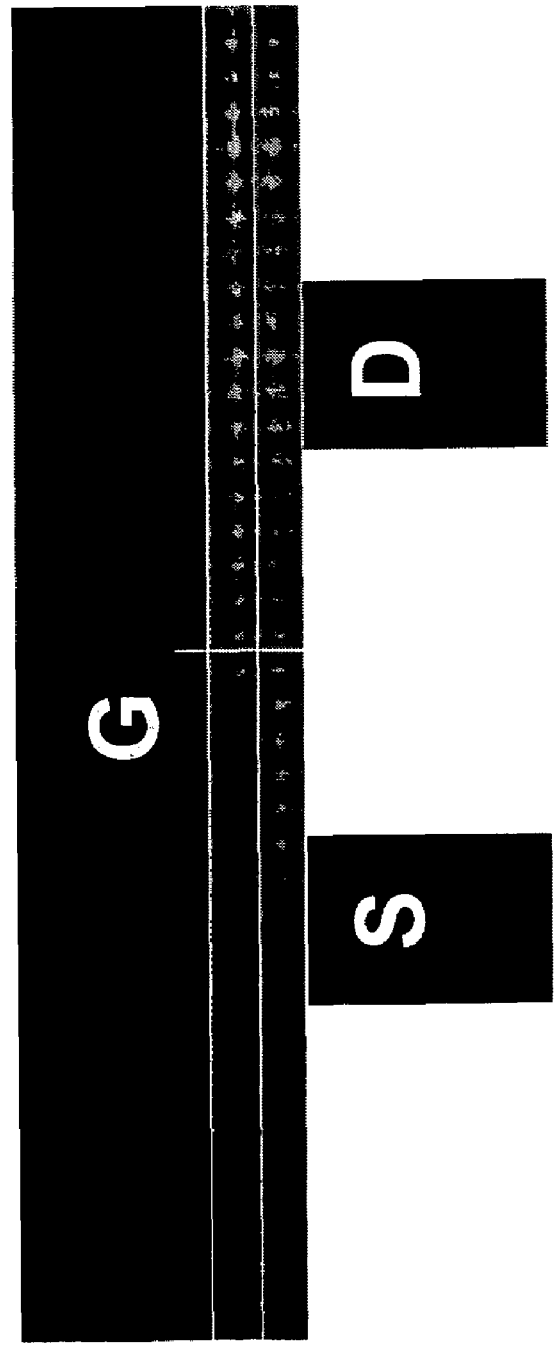
FIG. 2 illustrates an exemplary structure of a TFT (thin-film transistor) memory cell in examples consistent with the invention.

FIG. 2 illustrates an exemplary structure of a TFT memory cell having a gate 20, a storage region 22, a channel region 24, a source region 26, and a drain region 28. FIG. 2 also illustrates a circuitry symbol for a memory cell, suggesting the equivalent circuit of the memory cell illustrated. As an example, one way of operating the memory cell may include: (1) programming by channel hot-electron injection, i.e. by injecting electrons from the channel region 24 to the storage 22; (2) erasing by band-to-band hot-hole injection, i.e. by injecting holes from the channel region 24; (3) reading by forward (F) read or reverse (R) read. Forward and reverse read operations may involve alternating the role of source and drain regions compared to their roles during programming. Table 1 below illustrates an example of possible operating voltages (in volts) for the drain and source regions 28 and 26 and the gate 20 during programming, erasing, forward reading, and reverse reading operations.

TABLE 1

|          | D   | S   | G   |
|----------|-----|-----|-----|
| Program  | 5   | 0   | 10  |
| Erase    | 10  | 10  | −10 |
| Read (F) | 1.6 | 0   | 4   |
| Read (R) | 0   | 1.6 | 4   |

Figure 3:
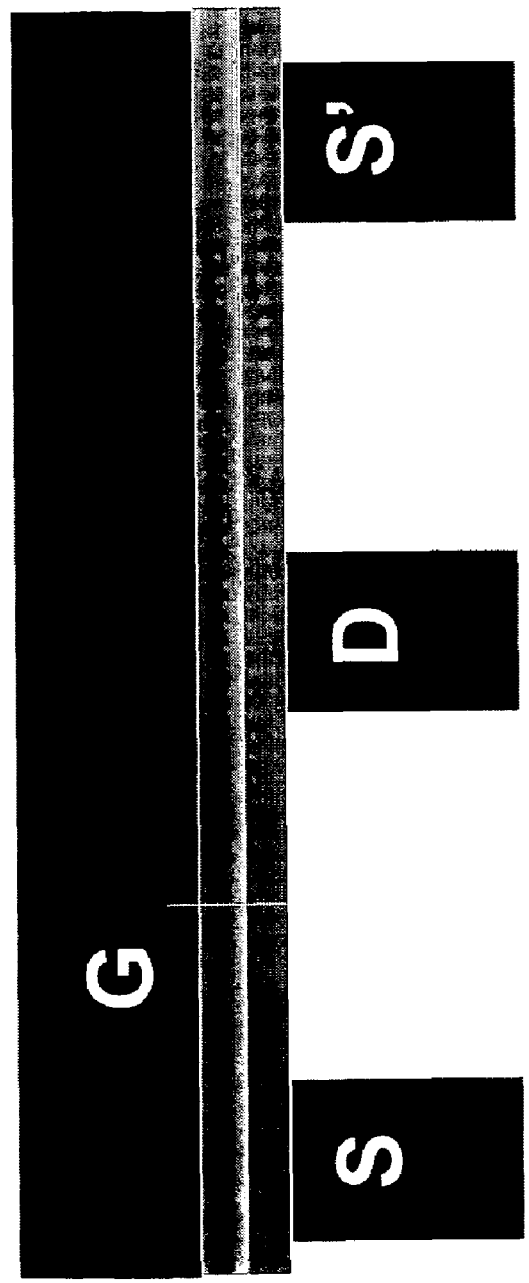
FIG. 3 illustrates another exemplary configuration of a TFT memory cell in examples consistent with the invention.

FIG. 3 illustrates another configuration of a TFT memory cell having a gate 30, a storage region 32, a channel region 34, a source region 36, and a drain region 38, along with a circuitry symbol suggesting its equivalent circuit. In addition, an inhibit region 40, which is a region neighboring the drain region 38, is also illustrated in FIG. 3. In one example, the operation of a memory cell may similarly include: (1) programming by band-to-band hot-hole injection; (2) erasing by FN (Fowler-Nordheim) injection or tunneling; and (3) reading by forward (F) read or reverse (R) read. Table 2 below illustrates an example of possible operating voltages (in volts) for drain and source regions and gate during programming, erasing, forward reading, and reverse reading operations. In one example, the inhibit region 40 may be biased at 3V to prevent program disturb during programming, and the inhibit region 40 may be floated ("FL") during an erase operation.

TABLE 2

|          | D   | S   | G   | S'$_{(*)}$ |
|----------|-----|-----|-----|-----|
| Program  | 5   | 0   | −5  | 3   |
| Erase    | −10 | −10 | 10  | FL  |
| Read (F) | 1.6 | 0   | 4   | FL  |
| Read (R) | 0   | 1.6 | 4   | FL  |

Figure 4:
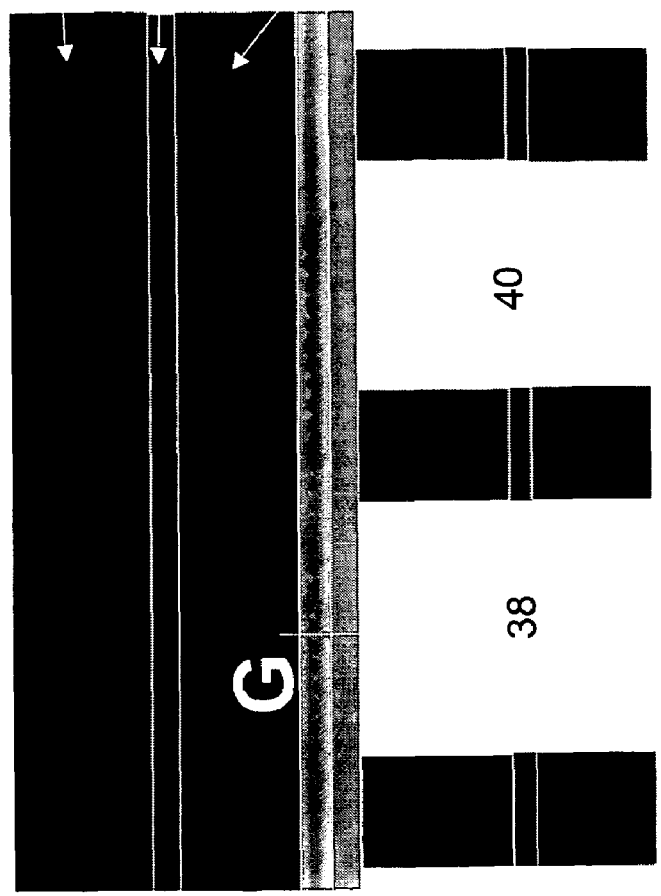
FIG. 4 illustrates sandwiched structures for a gate line, source line, drain line, and inhibit line in examples consistent with the invention.

In some examples, to improve the conductivity of the conductive lines or structures, such as word lines (gate lines) and bit lines (source/drain lines), different materials may be used. For example, a word line or a bit line may include one or more of a doped silicon, such p-type or n-type silicon, TiN, $TiSi_2$, WSi, and other metal silicides. In some examples, TiN may serve as a barrier layer to provide better interfacial characteristics between two layers, such as between a metal silicide layer and a silicon layer. For example, referring to FIG. 4, a gate line 30 may include a sandwiched structure having one or more metal silicide materials, such as TiN, $TiSi_2$, or WSi, between two doped polysilicon layers 30a and 30b. Similarly, each of the source line 36, drain line 38, and inhibit line 40 may have a similar or the same structure. In some examples, a conductive layer containing a metal silicide may reduce the line resistance and improve the stacking capability for forming a three-dimensional memory device.

Figure 5A:
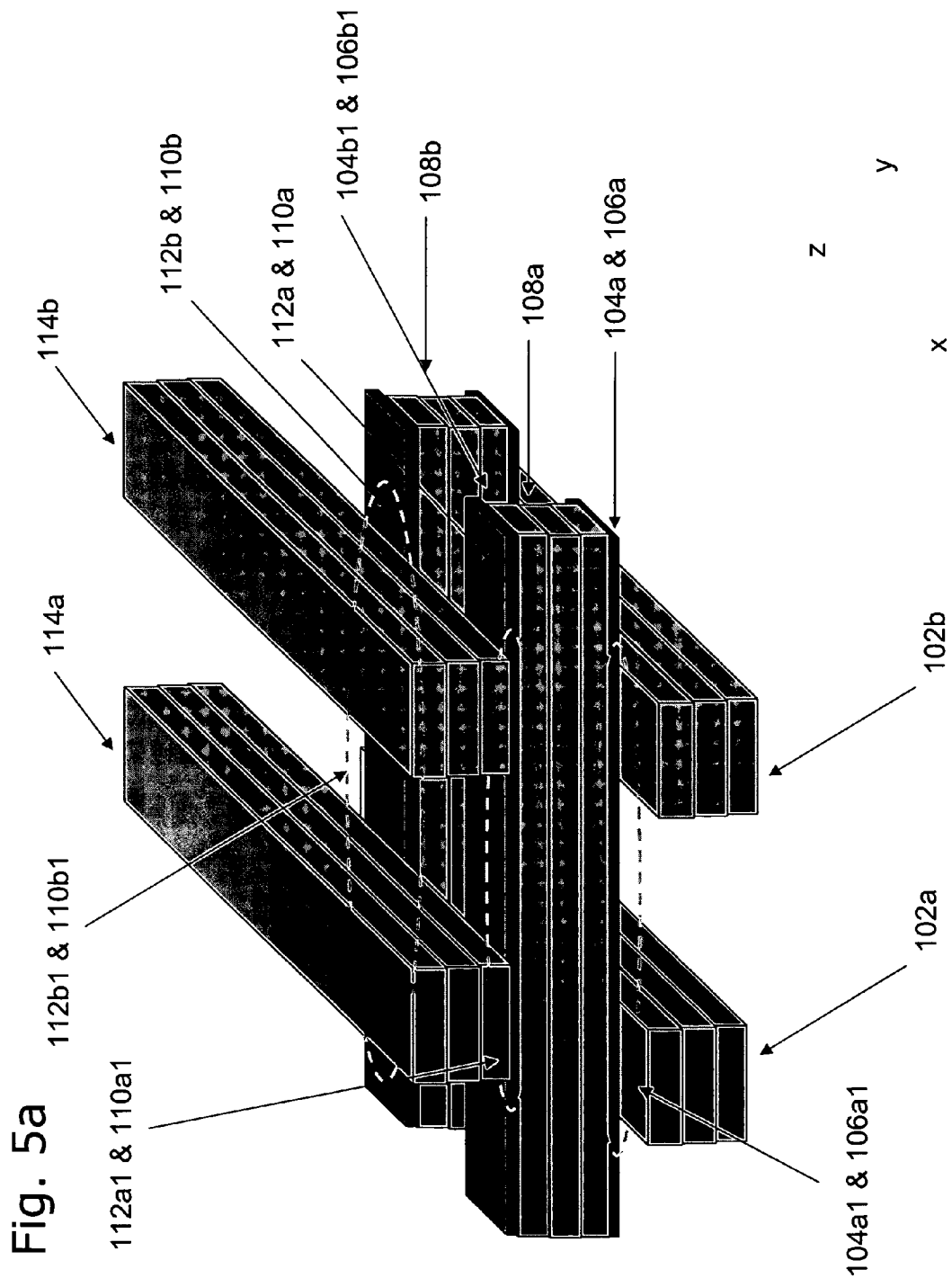

FIG. 5a illustrates an exemplary structure of a three-dimensional memory device. Referring to FIG. 5a, the memory device may include a first pair of bit lines 102a and 102b; a first pair of word lines 108a and 108b that cross over the first pair of bit lines 102a and 102b; a first pair of channel regions 104a1 and 104b1; and a first set of charge storage regions 106a1 and 106b1. FIG. 5a is a simplified drawing that shows channel region 104a1 and charge storage region 106a1 as one group, which in fact may contain two or more separate layers of materials as illustrated in FIG. 5e. Specifically, FIG. 5e illustrates one example of the configuration for the channel region 104a1 and charge storage region 106a1 in FIG. 5a. In one example, the charge storage region 106a1 may be provided above the channel region 104a1. In some examples, the charge storage region 106a1 may be provided by a charge storage line 106a, and the channel region 104a1 may be provided by a channel line 104a, which may be provided under the charge storage line 106a. As illustrated in FIG. 5e, each of the charge storage line 106a and the channel line 104a may be substantially parallel with the word line 108a that is provided over the charge storage line 106a. The channel regions 104b1, which is associated with the word line 108b, may have a similar configuration as the channel region 104a. And the charge storage region 106b1, which is also associated with the word line 108b, may have a similar configuration as the charge storage region 106a1.

In the example illustrated in FIG. 5a and 5e, the first pair of channel regions 104a and 104b may be substantially parallel with the first pair of word lines 108a and 108b. Each of the channel regions 104a and 104b may be disposed at least between the locations where a corresponding word line crosses over the first pair of bit lines 102a and 102b, e.g. disposed at least between the source and drain regions provided by the bit lines 102a and 102b. And each of the charge storage regions 106a1 and 106b1 may be disposed at least between the corresponding word line and the corresponding channel region to serve as data storage areas operated by the corresponding gate regions, which are provided by the word lines 108a and 108b.

The structure described above provides a two-dimensional memory array. Referring to FIG. 5a, to provide a three-dimensional structure, the memory device may further include a second pair of bit lines 114a and 114b that cross over the first pair of word lines 108a and 108b; a second pair of channel regions 112a1 and 112b1; a second set of charge storage regions 110a1 and 110b1. Similar to the first pair of channel regions 104a and 104b, the second pair of channel regions 112a1 and 112b1 may be provided by a pair of channel lines. For example, the second pair of channel regions 112a1 and 112b1 may be substantially parallel with the first pair of word lines 108a and 108b and each may be disposed at least between the locations where the second pair of bit lines 114a and 114b cross over the corresponding word line, e.g. at least between the source and drain regions provided by the bit lines 114a and 114b. And each of the charge storage regions 112a1 and 112b1 may be disposed at least between the corresponding word line and the corresponding channel region to serve as data storage areas operated by the corresponding gate regions, which are provided by the word lines 114a and 114b.

In the illustrated example, the first pair of channel lines 104a and 104b, the first pair of charge storage lines 106a and 106b, and the first pair of word lines 108a and 108b may be generally aligned or have similar line-style patterns. Such design may simplify the manufacturing process of the memory device without requiring separate lithography or patterning processes or masks. Similarly, the second pair of channel lines 112a and 112b, the second pair of charge storage lines 110a and 110b, and the first pair of word lines 108a and 108b may be generally aligned or have similar line-style patterns. Therefore, referring to FIG. 5a, these structures may be stacked to form two line-styled structures, which may be configured to cross with the first pair of bit lines 102a and 102b and the second pair of bit lines 114a and 114b, such as at an approximately perpendicular direction.

In some examples, the first pair of bit lines 102a and 102b, the word lines 108a and 108b, and the second pair of bit lines 114a and 114b each may include a conductive material, such as one or more of a doped polysilicon, or n-type polysilicon in particular, TiN, TiSi2, WSi, and other metal silicides, for providing source and drain regions of TFT memory cells. In some examples, a sandwiched structure having at least one metal silicide layer between two polysilicon layers may be used. FIG. 5a illustrate the example of using a sandwiched structure for the bit lines and word lines of the memory device. In some applications, TiN may be provided as a barrier layer between metal silicide and polysilicon materials.

For providing an active region, the first pair of channels lines 104a and 104b and the second pair of channel lines 112a and 112b each may include doped silicon, such as p-type silicon or p-type amorphous silicon. For providing charge-storing capabilities, the first set of charge storage regions 106a1 and 106a2 and the second set of charge storage regions 110a1 and 110b1 may include a charge storage layer, such as a silicon nitride layer. In particular, to provide adequate electron and/or hole tunneling effects, the silicon nitride layer may be sandwiched between two dielectric layers, such as silicon oxide layers.

Although the schematic diagram shows only two pairs of bit lines and one pair of word lines, the illustrated structure can be horizontally expanded or vertically stacked with more word lines, more bit lines, and more of the corresponding channel regions and charge storage regions for providing additional memory cells. In other words, the number of word lines, bit lines, channel lines, and charge trapping lines may be vertically and/or horizontally expanded to provide a large, three-dimensional memory matrix having numerous memory cells.

Figure 5B:
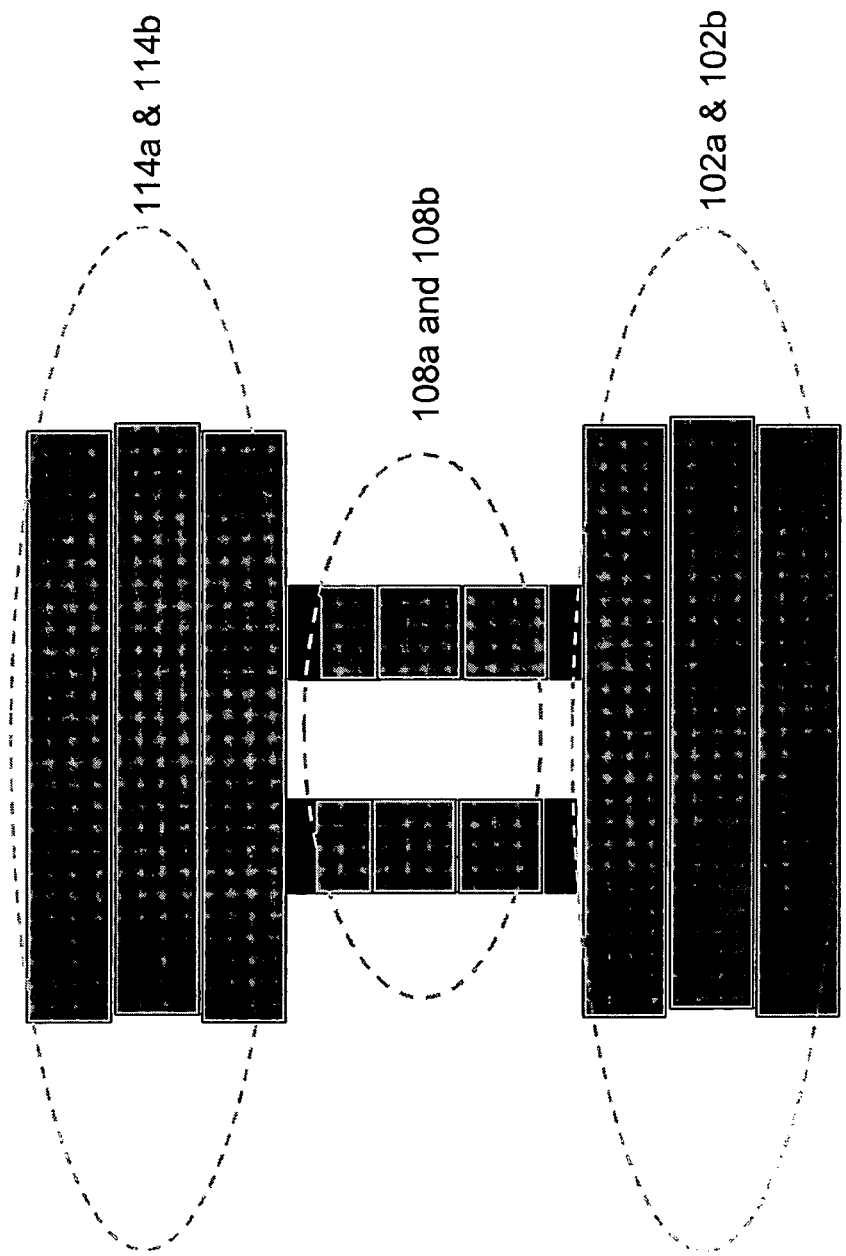
Figure 5C:
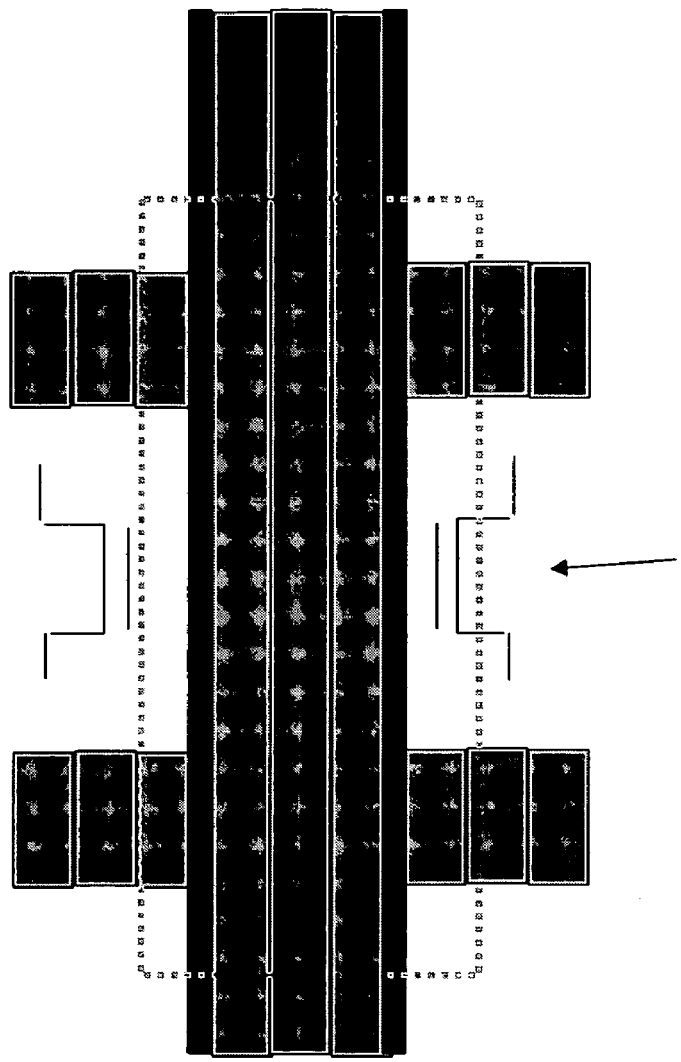

As shown in FIG. 5a, a memory cell may be provided at each intersection of one word line and one bit line to store one or more bits of data. FIG. 5b illustrates a schematic cross-sectional view from the y direction of FIG. 5a to illustrate the structure of four memory cells. The two cells formed by bit lines 102a and 102b (as source and drain regions) and word lines 108a and 108b (as gate regions) have their gate regions above the source and drain regions. And the two cells formed by bit lines 114a and 114b (as source and drain regions) and the same gate lines 108a and 108b (as gate regions) have their gates below the source and drain regions, thereby providing two "inverted" cells that share the same gate regions with two "un-inverted" cells. FIG. 5c illustrates another schematic cross-sectional view of the memory device in FIG. 5a from the x direction and equivalent circuitry symbols. Referring to FIG. 5c, two memory cells 120a and 120b, such as SONOS (silicon-oxide-nitride-oxide-silicon) TFT memory cells, are provided by the structure shown in the figure.

Figure 5D:
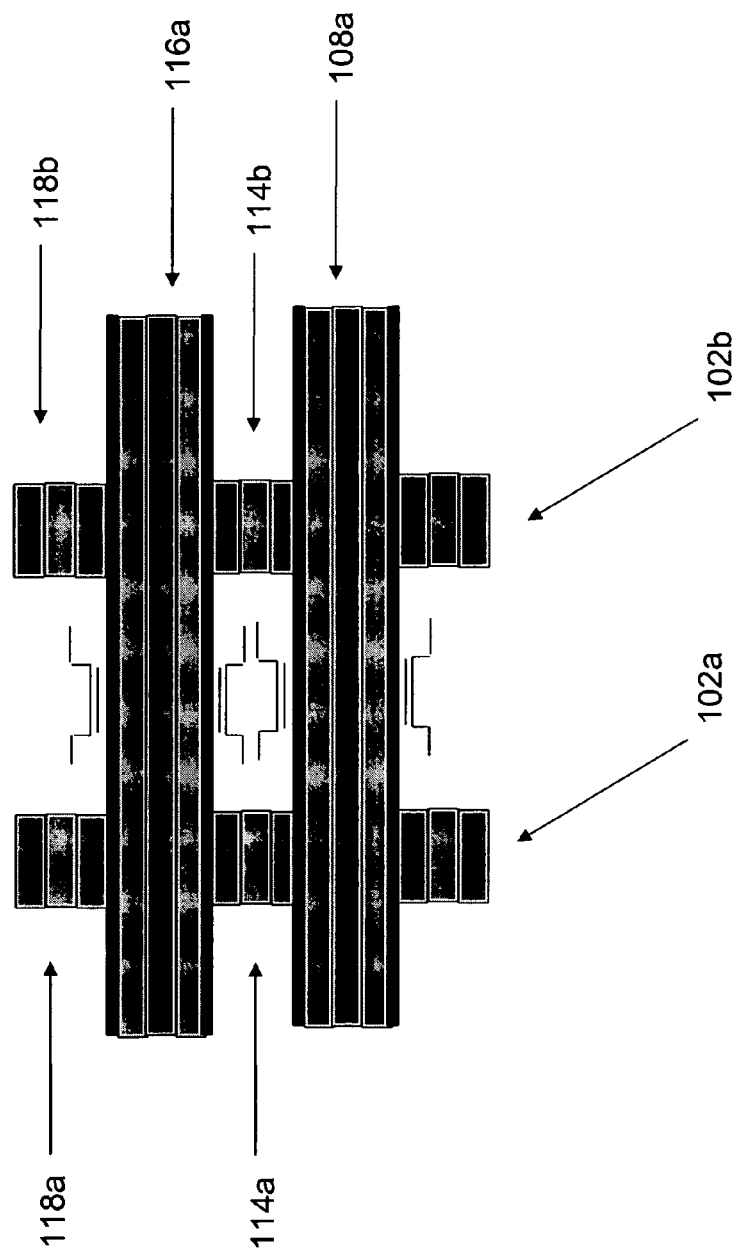

FIG. 5d illustrates a schematic diagram showing four memory cells provided by a stacked structure of five layers, which include three pairs of bit lines 102a & 102b, 114a & 114b, and 118a & 118b and two word lines 108a and 116a. In one example, the first layer may have more bit lines in addition to bit lines 102a and 102b; the second layer may have more word lines, such as a pair or more, in addition to the word line 108a; the third layer may have more bit lines in addition to bit lines 114a and 114b; the second layer may have more word lines, such as a pair or more, in addition to the word line 116a; and the fifth layer may have more bit lines in addition to bit lines 118a and 118b. Additionally, appropriate channel and charge storage regions may be formed between the crossing bit lines and word lines in a manner similar to what is illustrated in FIG. 5a and FIG. 5e.

FIG. 5a illustrates an example having one layer of word lines 108a and 108b commonly shared by two layers of bit lines 102a, 102b, 114a, and 114b. A three dimensional memory device may include three stacked layers of word lines and bit lines to provide numerous memory cells. As illustrated in FIG. 5a, the memory device may have at least two layers of memory arrays each containing four or more memory cells, with two or more word lines 108a and 108b commonly shared by the two layers of the memory arrays. Specifically, the word lines 108a and 108b coupled with the memory cells and provide gate regions of the memory cells. Additionally, the first pair of bit lines 102a and 102b cross under the two word lines 108a and 108b and provide source and drain regions to the first or lower layer of the two layers of the memory arrays. Similarly, the second pair of bit lines 114a and 114b cross over the two word lines 108a and 108b and provide source and drain regions to the second or upper layer of the two layers of the memory arrays.

As illustrated above, the first set of channel regions 104a1 and 106b1 are disposed between the source and drain regions to the first or lower layer of the two layers of the memory arrays, and the second set of channel regions 112a1 and 112b1 are disposed between the source and drain regions to the second or upper layer of the two layers of the memory arrays. In addition, charge storage regions 106a1 and 106b1 each is disposed between a corresponding word line of the two word lines 108a and 108b and a corresponding channel region of the first and second sets of channel regions 104a1, 104b1, 112a1, and 112b1.

Figure 5F:
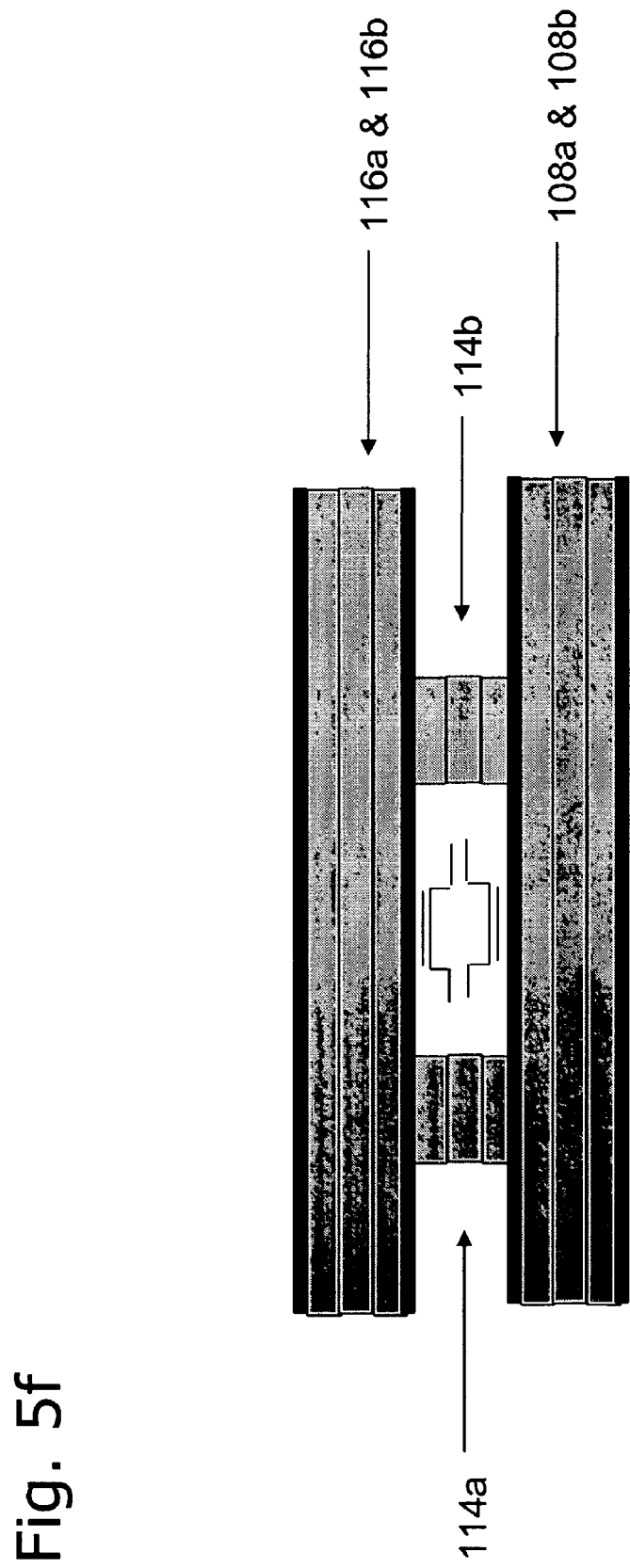

For a three-layer structure, an alternative configuration to the structure illustrated in FIG. 5a may be provided to include one layer of bit lines commonly shared by two layers of word lines. For example, the structure illustrated in FIG. 5d, when provided without bit lines 102a, 102b, 118a, and 118d, may become the structure illustrated in FIG. 5f. Referring to FIG. 5f, a three-dimensional memory device may be provided with one or more pairs of bit lines 114a and 114b commonly shared by two layers of word lines, the first layer may have two or more word lines 108a and 108b. The second word line 108b is not shown in FIG. 5f but may be located behind the word line 108a in the same horizontal plane, as illustrated in FIG. 5a. Similarly, the second layer of word lines may have two or more word lines 116a and 116b.

Referring to FIG. 5f, with two layers of word lines and one layer of common bit lines, the memory device may include two layers of memory arrays each containing four or more memory cells. In particular, the two bit lines 114a and 114b are commonly shared by the two layers of the memory arrays, with the bit lines 114a and 114b coupled with the memory cells and providing source and drain regions of the memory cells. The first pair of word lines 108a and 108b cross under the two bit lines 114a and 114b and may provide gate regions to the first or lower layer of the two layers of the memory arrays. Similarly, the second pair of word lines 116a and 116b cross over the two bit lines 114a and 114b and may provide gate regions to a second layer of the two layers of the memory arrays. To provide the memory cells, channel regions are disposed between the source and drain regions provided by the bit lines 114a and 114b, and charge storage regions may be provided with each of them disposed between a corresponding word line of the first and second pairs of word lines 108a, 108b, 116a, 116b and a corresponding channel region of the multiple channel regions in the memory device.

Figure 6A:
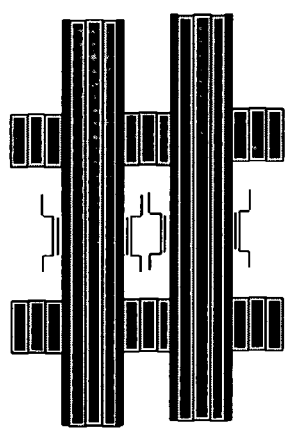
FIGS. 6a and 6b illustrate exemplary memory arrays provided by three dimensional memory devices in examples consistent with the invention.
Figure 6B:
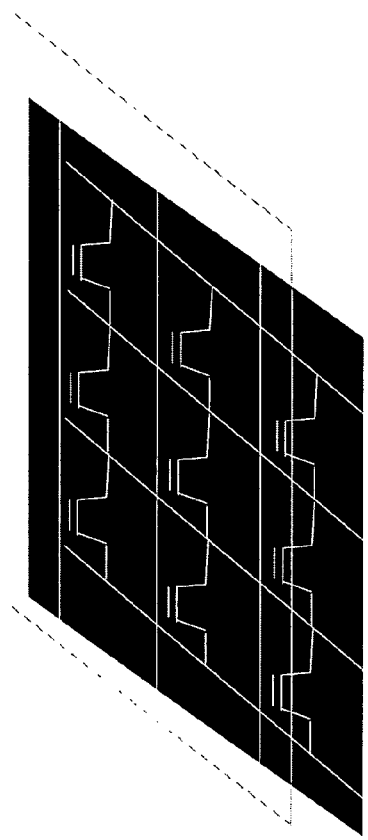

Taking a five-stacked-layer structure as an example, FIGS. 6a and 6b further illustrate the memory array formed by first layer L1 and second layer L2. In one example, layer L1 provides source and drain lines as bit lines of the memory array, and layer L2 provides gate lines as word lines of the memory array.

As discussed above, devices have been described. The foregoing disclosure of various examples consistent with the present invention has been presented for purposes of illustration and description. It is not intended to be exhaustive or to limit the invention to the precise forms disclosed. Many variations and modifications of the examples described herein can be made without departing from the spirit of the invention. Accordingly, the scope of the invention is to be defined only by the claims appended hereto, and by their equivalents.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A memory device comprising:
   a first pair of bit lines; a first pair of word lines over the first pair of bit lines and configured to cross over the first pair of bit lines;
   a first pair of channel regions substantially parallel with the first pair of word lines and each disposed at least between the locations where a corresponding word line of the first pair of word lines crosses over the first pair of bit lines and disposed between the corresponding word line and the first pair of bit lines;
   a first pair of charge storage lines comprising a first set of charge storage regions each disposed at least between the corresponding word line and a corresponding channel region of the first pair of channel regions;
   a second pair of bit lines over the first pair of word lines and configured to cross over the first pair of word lines;
   a second pair of channel regions substantially parallel with the first pair of word lines and each disposed at least between the locations where the second pair of bit lines cross over the corresponding word line and disposed between the second pair of bit lines and the corresponding word line; and
   a second pair of charge storage lines comprising a second set of charge storage regions each disposed at least between the corresponding word line and the corresponding channel region.

2. The memory device of claim 1, wherein the memory device comprises a three-dimensional memory device.

3. The memory device of claim 1, wherein at least one of the first pair of word lines and the first and second pairs of bit lines comprises at least one of doped polysilicon, TiN, TiSi.sub.2, WSi, and metal silicide.

4. The memory device of claim 1, wherein the first pair of word lines cross over the first pair of bit lines and cross under the second pair of bit lines approximately perpendicularly.

5. The memory device of claim 1, wherein at least one of the first and second sets of channel regions comprises doped silicon.

6. The memory device of claim 1,
   wherein the first set of charge storage regions are provided by the first pair of charge storage lines that are substantially parallel with the first pair of word lines and the first pair of channel regions and are disposed between with the first pair of word lines and the first pair of channel regions; and
   wherein the second set of charge storage regions are provided by the second pair of charge storage lines that are substantially parallel with the first pair of word lines and the second pair of channel regions and are disposed between with the first pair of word lines and the second pair of channel regions.

7. The memory device of claim 1, wherein at least one of the first and second sets of charge storage regions comprises a tri-layer structure including two dielectric layers with a charge storage layer in between.

8. The memory device of claim 7, wherein the two dielectric layers each comprises a silicon oxide layer.

9. The memory device of claim 7, wherein the charge storage layer comprises at least one of a silicon nitride layer, an isolated silicon layer, an aluminum oxide layer, and a silicon nanocrystal layer.

10. The memory device of claim 1, wherein the memory cells in the memory device are programmed by channel hot electrons and erased by band-to-band hot holes.

11. A memory device comprising:
    two layers of memory arrays each containing at least four memory cells;
    two word lines commonly shared by the two layers of the memory arrays, the word lines coupled with the memory cells and providing gate regions of the memory cells;
    a first pair of bit lines crossing under the two word lines and providing source and drain regions to a first layer of the two layers of the memory arrays;
    a second pair of bit lines crossing over the two word lines and providing source and drain regions to a second layer of the two layers of the memory arrays;

a first set of channel regions disposed between the source and drain regions to the first layer of the two layers of the memory arrays;

a second set of channel regions disposed between the source and drain regions to the second layer of the two layers of the memory arrays; and charge storage lines comprising charge storage regions each disposed between a corresponding word line of the two word lines and a corresponding channel region of the first and second sets of channel regions.

12. The memory device of claim 11, wherein at least one of the word lines and the first and second pairs of bit lines comprises at least one of doped polysilicon, TiN, TiSi.sub.2, WSi, and metal silicide.

13. The memory device of claim 11, wherein the first pair of word lines cross over the first pair of bit lines and cross under the second pair of bit lines approximately perpendicularly.

14. The memory device of claim 11, wherein at least one of the first and second sets of channel regions comprises doped silicon.

15. The memory device of claim 11, wherein the charge storage regions are provided by the charge storage lines that are substantially parallel with the word lines, each of the charge storage lines being disposed between a neighboring word line and a neighboring channel region.

16. The memory device of claim 11, wherein at least one of the charge storage regions comprises a tri-layer structure including two dielectric layers with a charge storage layer in between.

17. The memory device of claim 16, wherein the charge storage layer comprises at least one of a silicon nitride layer, an isolated silicon layer, an aluminum oxide layer, and a silicon nanocrystal layer.

18. The memory device of claim 16, wherein the two dielectric layers each comprises a silicon oxide layer.

19. The memory device of claim 11, wherein the memory cells in the memory device are programmed by channel hot electrons and erased by band-to-band hot holes.

20. The memory device of claim 11, wherein the memory device comprises a three-dimensional memory device.

21. A memory device comprising:

two layers of memory arrays each containing at least four memory cells;

two bit lines commonly shared by the two layers of the memory arrays, the bit lines coupled with the memory cells and providing source and drain regions of the memory cells;

a first pair of word lines crossing under the two bit lines and providing gate regions to a first layer of the two layers of the memory arrays;

a second pair of word lines crossing over the two bit lines and providing gate regions to a second layer of the two layers of the memory arrays;

channel regions disposed between the source and drain regions; and charge storage lines comprising charge storage regions each disposed between a corresponding word line of the first and second pairs of word lines and a corresponding channel region of the channel regions.

22. The memory device of claim 21, wherein at least one of the bit lines and the first and second pairs of word lines comprises at least one of doped polysilicon, TiN, TiSi.sub.2, WSi, and metal silicide.

23. The memory device of claim 21, wherein the bit lines cross over the first pair of word lines and cross under the second pair of word lines approximately perpendicularly.

24. The memory device of claim 21, wherein at least one of the channel regions comprises doped silicon.

25. The memory device of claim 21, wherein the charge storage regions are provided by the charge storage lines that are substantially parallel with the word lines, each of the charge storage lines being disposed between a neighboring word line and a neighboring channel region.

26. The memory device of claim 21, wherein at least one of the charge storage regions comprises a tri-layer structure including two dielectric layers with a charge storage layer in between.

27. The memory device of claim 26, wherein the charge storage layer comprises at least one of a silicon nitride layer, an isolated silicon layer, an aluminum oxide layer, and a silicon nanocrystal layer.

28. The memory device of claim 26, wherein the two dielectric layers each comprises a silicon oxide layer.

29. The memory device of claim 21, wherein the memory cells in the memory device are programmed by channel hot electrons and erased by band-to-band hot holes.

30. The memory device of claim 21, wherein the memory device comprises a three-dimensional memory device.

* * * * *